United States Patent
Langhammer

(10) Patent No.: US 10,873,332 B2
(45) Date of Patent: *Dec. 22, 2020

(54) ADDER CIRCUITRY FOR VERY LARGE INTEGERS

(71) Applicant: Intel Corporation, Santa Clara, CA (US)

(72) Inventor: Martin Langhammer, Alderbury (GB)

(73) Assignee: Intel Corporation, Santa Clara, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 16/206,748

(22) Filed: Nov. 30, 2018

(65) Prior Publication Data

US 2019/0114140 A1  Apr. 18, 2019

Related U.S. Application Data

(60) Provisional application No. 62/697,265, filed on Jul. 12, 2018.

(51) Int. Cl.
*G06F 7/506* (2006.01)
*H03K 19/17736* (2020.01)
(Continued)

(52) U.S. Cl.
CPC ....... *H03K 19/17744* (2013.01); *G06F 7/503* (2013.01); *G06F 7/505* (2013.01);
(Continued)

(58) Field of Classification Search
CPC ......... H03K 19/17744; H03K 19/1737; H03K 19/17724; G06F 7/503; G06F 7/505; G06F 7/506; G06F 17/16
(Continued)

(56) References Cited

U.S. PATENT DOCUMENTS 3,316,393 A * 4/1967 Ruthazer ................. G06F 7/507
708/714
3,553,446 A * 1/1971 Kruy ....................... G06F 7/507
708/714

(Continued)

OTHER PUBLICATIONS

Ladner et al, "Parallel Prefix Computation", Journal of the Association for Computing Machinery, vol. 27, No. 4, Oct. 1980, pp. 831-838.*

(Continued)

*Primary Examiner* — Tan V Mai
(74) *Attorney, Agent, or Firm* — Treyz Law Group, P.C.; Jason Tsai

(57) ABSTRACT

An integrated circuit that includes very large adder circuitry is provided. The very large adder circuitry receives more than two inputs each of which has hundreds or thousands of bits. The very large adder circuitry includes multiple adder nodes arranged in a tree-like network. The adder nodes divide the input operands into segments, computes the sum for each segment, and computes the carry for each segment independently from the segment sums. The carries at each level in the tree are accumulated using population counters. After the last node in the tree, the segment sums can then be combined with the carries to determine the final sum output. An adder tree network implemented in this way asymptotically approaches the area and performance latency as an adder network that uses infinite speed ripple carry adders.

20 Claims, 12 Drawing Sheets

(51) Int. Cl.
*G06F 7/505* (2006.01)
*G06F 7/503* (2006.01)
*G06F 17/16* (2006.01)
*H03K 19/173* (2006.01)
*H03K 19/17724* (2020.01)

(52) U.S. Cl.
CPC .............. *G06F 7/506* (2013.01); *G06F 17/16* (2013.01); *H03K 19/1737* (2013.01); *H03K 19/17724* (2013.01); *G06F 2207/4812* (2013.01); *G06F 2207/5063* (2013.01)

(58) Field of Classification Search
USPC .................................................. 708/710–714
See application file for complete search history.

(56) References Cited

U.S. PATENT DOCUMENTS

| | | | |
|---|---|---|---|
| 4,549,280 A | 10/1985 | Schomburg | |
| 4,858,168 A * | 8/1989 | Hwang | G06F 7/508 |
| | | | 708/713 |
| 4,958,312 A | 9/1990 | Ang et al. | |
| 5,047,974 A | 9/1991 | Young | |
| 5,117,386 A * | 5/1992 | Persoon | G06F 7/507 |
| | | | 708/711 |
| 5,122,982 A * | 6/1992 | Cohn | G06F 7/506 |
| | | | 708/710 |
| 5,278,783 A * | 1/1994 | Edmondson | G06F 7/508 |
| | | | 708/711 |
| 5,327,369 A * | 7/1994 | Ashkenazi | G06F 7/507 |
| | | | 708/274 |
| 5,726,927 A | 3/1998 | Wolrich et al. | |
| 5,784,305 A | 7/1998 | Nadehara | |
| 6,529,931 B1 | 3/2003 | Besz et al. | |
| 7,152,089 B2 * | 12/2006 | Harris | G06F 7/508 |
| | | | 708/710 |
| 7,509,368 B2 | 3/2009 | Anders et al. | |
| 7,523,153 B2 * | 4/2009 | Goyal | G06F 7/508 |
| | | | 708/714 |
| 2002/0143841 A1 * | 10/2002 | Farooqui | G06F 7/507 |
| | | | 708/710 |

OTHER PUBLICATIONS

Martin Langhammer et al., U.S. Appl. No. 16/052,336, filed Aug. 1, 2018.
Martin Langhammer et al., U.S. Appl. No. 16/147,098, filed Sep. 28, 2018.

* cited by examiner

ADDER CIRCUITRY FOR VERY LARGE INTEGERS

This application claims the benefit of provisional patent application No. 62/697,265, filed Jul. 12, 2018, which is hereby incorporated by reference herein in its entirety.

BACKGROUND

This relates generally to integrated circuits, such as field-programmable gate arrays (FPGAs). More particularly, the present disclosure relates to adder circuitry configured to perform large arithmetic operations on an FPGA.

Integrated circuits increasingly carry out custom functions such as encryption that have become essential to everyday life. Indeed, encryption is becoming increasingly valuable in a number of technical fields, such as financial transaction security. Encryption (as well as many other operations that can take place on an integrated circuit such as certain multiplication operations) may use increasingly large precision arithmetic that, in some cases, involve performing a final addition operation to sum together operands having a large precision.

In some cases, for example, the precision of the operands may be on the order of thousands of bits. The final addition operation is carried out by a final adder circuit. Since the final adder circuit typically includes smaller adders chained together to accommodate the large precision arithmetic involved with summing the operands, the final adder circuit may represent a critical path for an encryption and/or multiplication operation implemented on an integrated circuit. In practice, the final adder circuit occupies a substantial amount of area on the integrated circuit, consumes a relatively large amount of power, and introduces additional latency in the integrated circuit.

It is within this context that the embodiments described herein arise.

DETAILED DESCRIPTION

The present embodiments relate to a large adder network that includes a tree of adder nodes. Each adder node may receive at least two very large inputs (e.g., inputs on the order of hundreds or thousands of bits). The inputs may be organized into multiple segments by evenly dividing up the input bit indices. Additions for a particular input segment may be performed independently from additions of other segment indices.

Each adder node may separately account for the carries of each segment. The segment carries output from each adder node in the same level of the tree can then be added together while still maintaining a separate carry sum for each segment. The segment addition pipeline may be independent (in terms of compute logic and latency) of the segment carry pipeline. In other words, the carry bits do not affect the sum bits until after a final node at the bottom of the adder tree. The final node in the adder tree may output a sum vector. A final adder stage can then add together the sum vector with a carry vector output from the segment carry pipeline to compute the final result.

Configured and operated in this way, the large adder network asymptotically approaches the same area and latency (for a large amount of very large integers) as a network of infinite speed ripple carry adders (i.e., the performance of the adder network is independent of the speed of the ripple carry adder but is dependent on the speed of the combinatorial logic and routing on the device). As a result, the overall adder network will be significantly smaller and faster than conventional adder architectures.

It will be recognized by one skilled in the art, that the present exemplary embodiments may be practiced without some or all of these specific details. In other instances, well-known operations have not been described in detail in order not to unnecessarily obscure the present embodiments.

Figure 1:
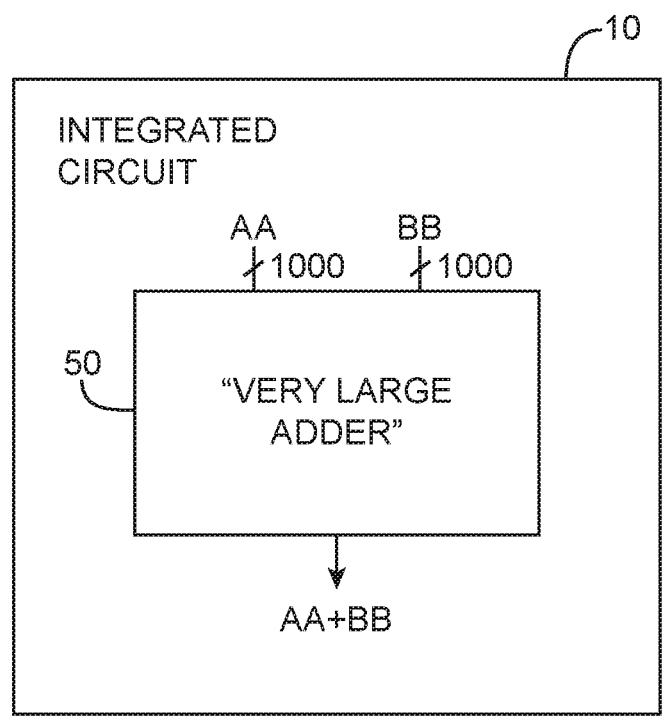
FIG. 1 is a diagram of an illustrative integrated circuit that includes adder circuitry in accordance with an embodiment.

With the foregoing in mind, FIG. 1 is a diagram of an integrated circuit 10 that may implement arithmetic operations. A designer may want to implement functionality such as large precision arithmetic operations on integrated circuit device 10 (e.g., a field-programmable gate array (FPGA) or an application-specific integrated circuit (ASIC)). As shown in FIG. 1, integrated circuit 10 may include a "very large" adder network such as adder 50. In the example of FIG. 1, adder 50 may be referred to as a very large adder because it is configured to sum together two inputs AA and BB, each having 1000 bits.

In general, very large adder 50 may be used to combine inputs with more than 50 bits, at least 100 bits, hundreds of bits, 100-1000 bits, at least 1000 bits, thousands of bits, tens of thousands of bits, hundreds of thousands of bits, or even millions of bits. Adder network 50 might also sum together more than two very large numbers (e.g., adder 50 can be used to combine more than two large integers, four or more large integers, eight or more large integers, sixteen or more large integers, etc.).

Figure 2:
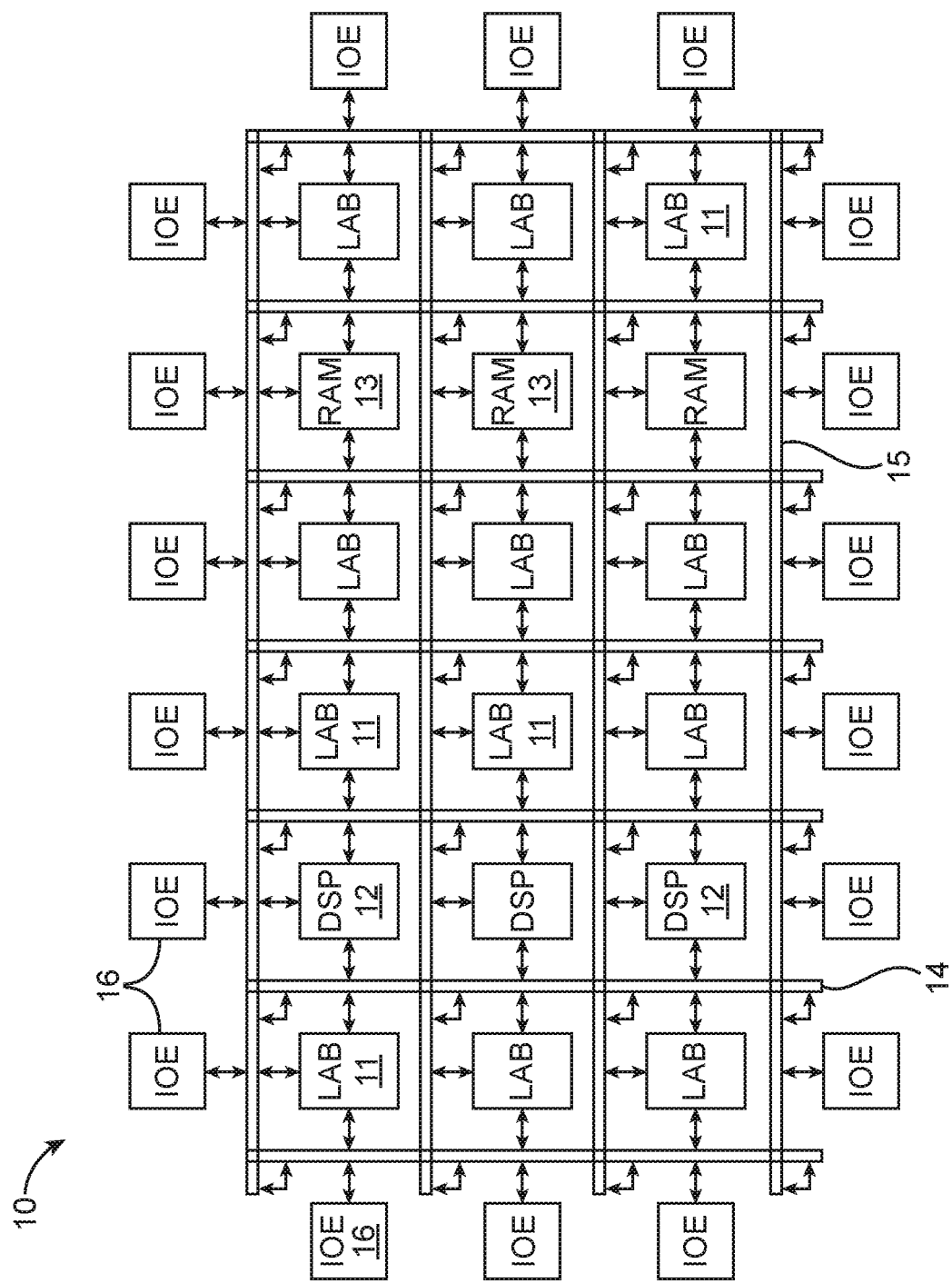
FIG. 2 is a diagram of an illustrative programmable integrated circuit in accordance with an embodiment.

Integrated circuit 10 might be implemented as a programmable integrated circuit device such as programmable logic device 10 of FIG. 2, where large precision arithmetic has traditionally been challenging. As shown in FIG. 2, programmable logic device 10 may include a two-dimensional array of functional blocks, including logic array blocks (LABs) 11 and other functional blocks, such as random access memory (RAM) blocks 13 and specialized processing blocks such as digital signal processing (DSP) blocks 12 that are partly or fully hardwired to perform one or more specific tasks such as mathematical/arithmetic operations. Functional blocks such as LABs 110 may include smaller programmable regions (e.g., logic elements, configurable logic blocks, or adaptive logic modules) that receive input signals and perform custom functions on the input signals to produce output signals. Device 10 may further include programmable routing fabric that is used to interconnect LABs 11 with RAM blocks 13 and DSP blocks 12. The combination of the programmable logic and routing fabric is sometimes referred to as "soft" logic, whereas the DSP blocks are sometimes referred to as "hard" logic. The type of hard logic on device 10 is not limited to DSP blocks and may include other types of hard logic.

Programmable logic device 100 may contain programmable memory elements for configuring the soft logic. Memory elements may be loaded with configuration data (also called programming data) using input/output elements (IOEs) 102. Once loaded, the memory elements provide corresponding static control signals that control the operation of one or more LABs 11, programmable routing fabric, and optionally DSPs 12 or RAMs 13. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), resistive memory elements, combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 10 may have input/output elements (IOEs) 16 for driving signals off of device 10 and for receiving signals from other devices. Input/output elements 16 may include parallel input/output circuitry, serial data transceiver circuitry, differential receiver and transmitter circuitry, or other circuitry used to connect one integrated circuit to another integrated circuit. As shown, input/output elements 16 may be located around the periphery of the chip. If desired, the programmable logic device may have input/output elements 16 arranged in different ways.

The routing fabric (sometimes referred to as programmable interconnect circuitry) on PLD 10 may be provided in the form of vertical routing channels 14 (i.e., interconnects formed along a vertical axis of PLD 100) and horizontal routing channels 15 (i.e., interconnects formed along a horizontal axis of PLD 10), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns. Configurations in which very large adder network 50 is formed within a programmable device 10 such as a field-programmable gate array (FPGA) die will be described herein as an example and is not intended to limit the scope of the present embodiments.

Figure 3:
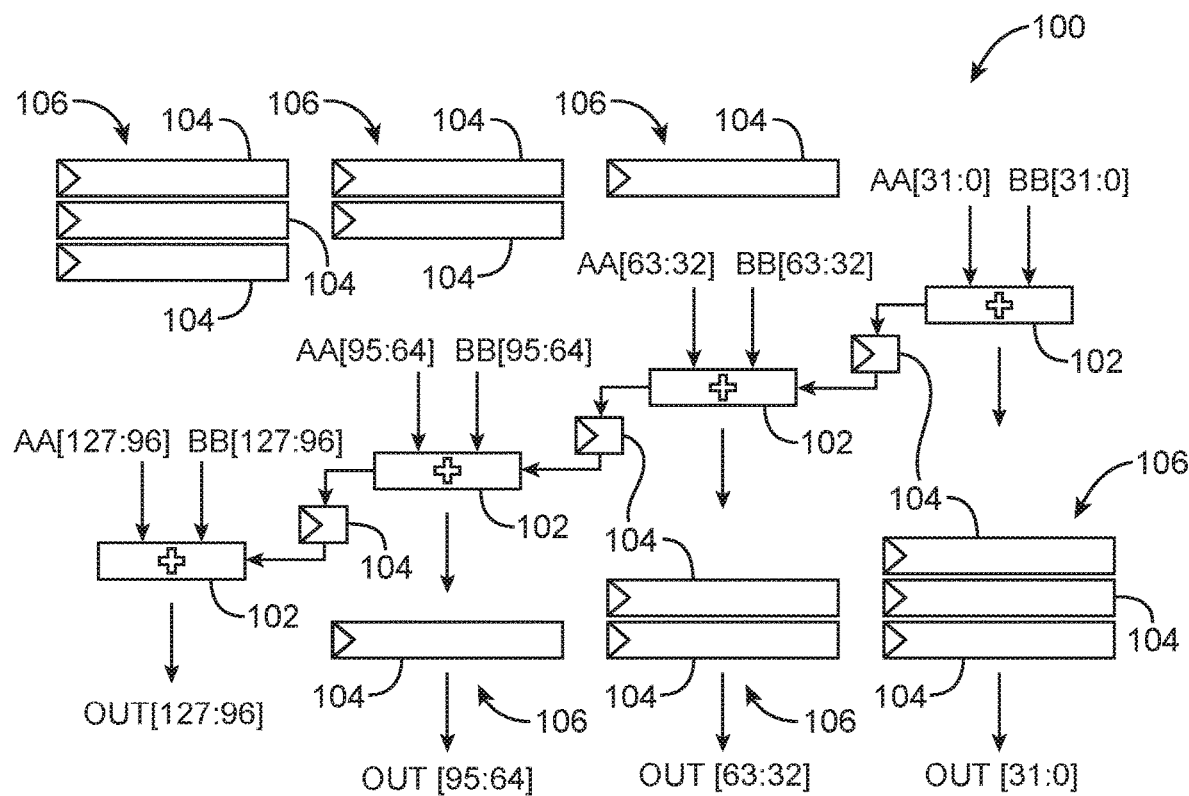
FIG. 3 is a diagram of a pipelined adder.

FIG. 3 illustrates a carry propagate adder such as a pipelined adder 100, which may handle the summation of large input operands by decomposing the operands into smaller segments. In the example of FIG. 3, pipelined adder 100 receives two 128-bit operands AA[127:0] and BB[127:0], which are each separated into four 32-bit segments (e.g., AA[31:0], AA[63:32], AA[95:64], and AA[127:96] and BB[31:0], BB[63:32], BB[95:64], and BB[127:96], respectively). By separating the two 128-bit operands into smaller 32-bit segments (sometimes referred to as "operand segments"), the sum of the two 128-bit operands may be determined with a set of four 32-bit sub-adders 102. Sub-adders 102 can be implemented as ripple carry adders that are pipelined together. Thus, as shown in FIG. 3, a first sub-adder 102 may sum AA[31:0] and BB[31:0], a second sub-adder 102 may sum AA[63:32] and BB[63:32] with a first carry-in value received from the first sub-adder 102, a third sub-adder 102 may sum AA[95:64] and BB[95:64] with a second carry-in value received from the second sub-adder 102, and a fourth sub-adder 102 may sum AA[127:96] and BB[127:96] with a third carry-in value received from the third sub-adder 102.

To properly use the first carry-in value during the summation of AA[63:32] and BB[63:32], operand segments AA[63:32] and BB[63:32] input to the second sub-adder 102 may be delayed by one or more clock cycles to arrive concurrently with the first carry-in value. For example, because the carry-out result from the addition of AA[31:0] and BB[31:0] is used as the first carry-in value in the summation of AA[63:32] and BB[63:32], the summation of AA[63:32] and BB[63:32] may be delayed until the carry-out from the first sub-adder 102, which may be stored in a register 104, is available. In some embodiments, to delay the operand segments AA[63:32] and BB[63:32], the pipelined adder 100 may route the operand segments AA[63:32] and BB[63:32] through a first delay chain 106, which may be implemented with one or more registers 104, memory, a first-in-first-out (FIFO) data structure, and/or the like, prior to receiving the operand segments AA[63:32] and BB[63:32] at the second sub-adder 102.

Further, to suitably delay the operand segments AA[95:64] and BB[95:64], pipelined adder 100 may route the operand segments AA[95:64] and BB[95:64] through a second delay chain 106, which, in some embodiments, may delay the operand segments AA[95:64] and BB[95:64] from arriving at the third sub-adder 102 for two or more clock cycles so that the operand segments AA[95:64] and BB[95:64] are available at the third sub-adder 102 concurrently with the second carry-in value received from the second sub-adder 102. Accordingly, the pipelined adder 100 may also include a third delay chain 106 to delay the operand segments AA[127:96] and BB[127:96] three or more clock cycles prior to their arrival at the fourth sub-adder 102 so that the operand segments AA[127:96] and BB[127:96] are concurrently available with the third carry-in value received from the third sub-adder 102.

Further, by concatenating the output of the first 32-bit adder 102 with the outputs of the second sub-adder 102, the third sub-adder 102, and the fourth sub-adder 102, the 128-bit sum of AA[127:0] and BB[127:0] may be formed. Since the first sub-adder 102 may calculate and output the sum of the operand segments AA[31:0] and BB[31:0] before any of the other sub-adders 102 (e.g., the second sub-adder 102, the third sub-adder 102, and the fourth sub-adder 102), pipelined adder 100 may be implemented to route the output of the first sub-adder 102 through a fourth delay chain 106. The fourth delay chain may delay the output of the first sub-adder 102 a number of clock cycles that may be dependent on the number of sub-adders 102 following the first sub-adder 102 in the pipelined adder 100. Accordingly, in the illustrated embodiment, the fourth delay chain 106 may delay the output of the first sub-adder 102 three clock cycles, but in other embodiments, the fourth delay chain 106 may be implemented to delay the output of the first sub-adder 102 a greater or fewer number of clock cycles. Further, the pipelined adder 100 may route the output of the second sub-adder 102 through a fifth delay chain 106 and the output of the third sub-adder 102 through a sixth delay chain 106 so that the outputs of each of the sub-adders 102 are available concurrently.

In large adders, the delay chains 106 of pipelined adder 100 may use significant resources on an integrated circuit, as the delay chains 106 may occupy a significant area in the integrated circuit device 12 and/or consume significant power in the integrated circuit device. Moreover, because each sub-adder 102 of pipelined adder 100 is arithmetically dependent on the computation of the previous sub-adder 102, pipelined adder 100 has to be placed in a contiguous area on the integrated circuit device, which may limit and/or restrict the use of available die area. Moreover, because sub-adders 102 are not independent, addition performed by the pipelined adder 100 may incur significant latencies to suitably delay input operand segments and outputs of the sub-adders 102.

Figure 4:
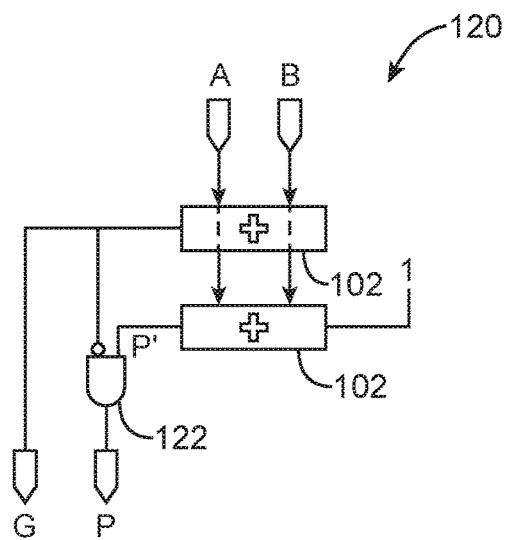
FIG. 4 is a diagram of a decoder circuit that can be used as part of a larger adder circuit.

Accordingly, as illustrated in FIG. 4, a decoder 120 may be implemented to decode a generate signal (G) and/or a propagate signal (P) using a set of independent sub-adders 102. In some embodiments, as described in greater detail below, a restructured adder may use the generate signal and/or propagate signal to determine the sum of two operand segments (e.g., AA[31:0] and BB[31:0]) at a sub-adder 102 independently from the output and/or carry-out value generated by another sub-adder 102.

To decode the generate signal, decoder 120 may, using a first sub-adder 102, compute a carry-out signal resulting from the sum of a first operand segment (A) and a second operand segment (B). The carry-out signal of the first sub-adder 102 may serve directly as the generate signal G. Additionally or alternatively, decoder 120 may output the generate signal from logic by, for example, zero extending the most significant bit at the sum output of the first sub-adder 102.

To decode the propagate signal, decoder 120 may, using a second sub-adder 102, compute a carry-out signal resulting from the sum of first operand segment A, second operand segment B, and a carry-in value of "1". The carry-out signal of the second sub-adder 102 (labeled as P' in FIG. 4) may be combined with an inverted version of the carry-out signal from the first sub-adder 102 using logic AND gate 122 to output the desired propagate signal P. Configured in this way, gate 122 computes the logical function: NOT(G) AND P'.

Figure 5:
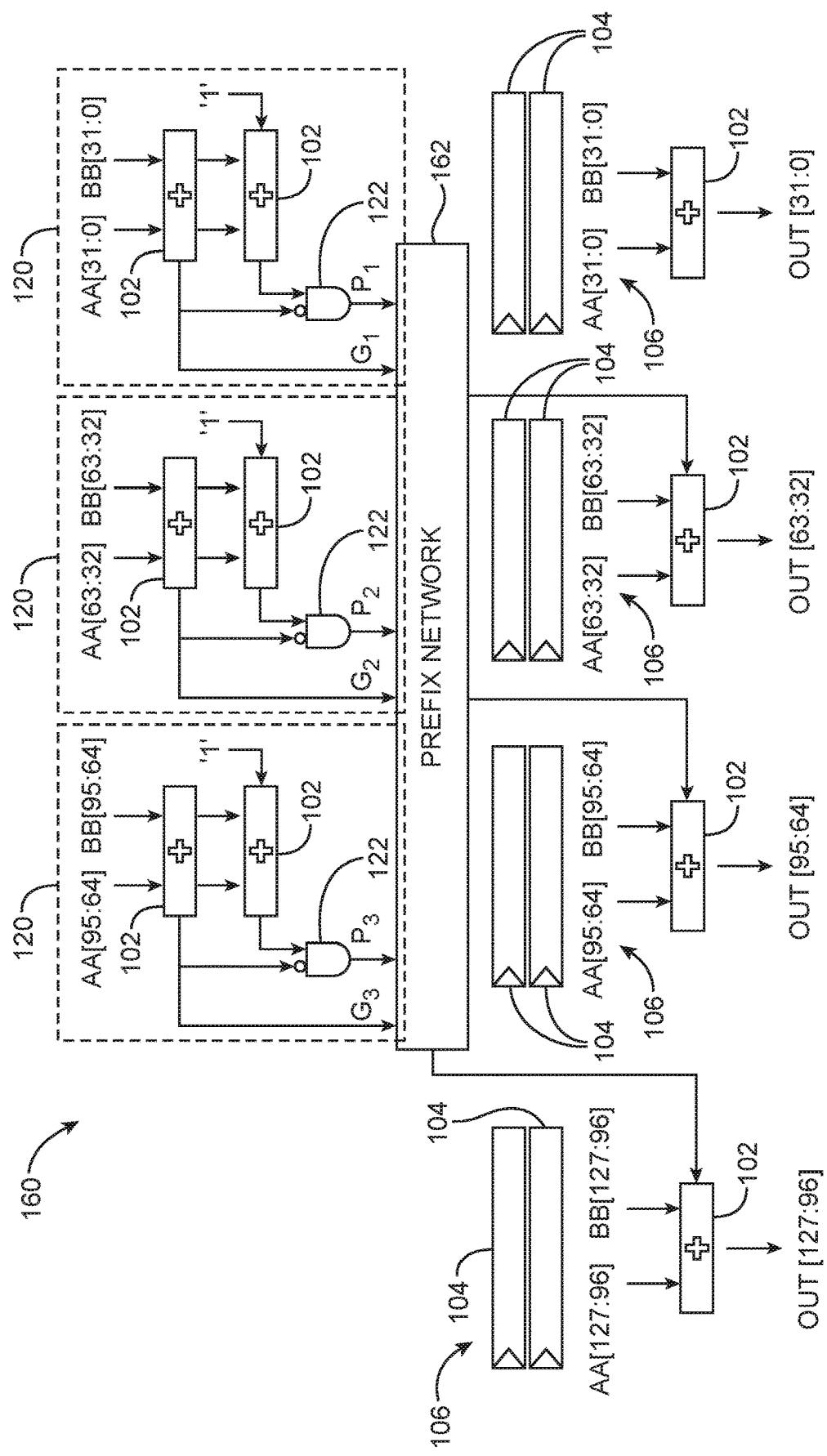
FIG. 5 is a diagram of a restructured adder that includes decoder circuits of the type shown in FIG. 4.

As discussed above, a restructured adder may use the generate signal and propagate signal to determine one or more sums at one or more sub-adders 102 independently from the outputs of the other sub-adders 102. Accordingly, FIG. 5 illustrates a restructured adder 160 that uses decoders 120 and a prefix network 162 to determine the sum of two operands. More specifically, using decoders 120 and the prefix network 162, the restructured adder 160 may determine the sum of two operands, each having a first precision, based in part on the sum of corresponding pairs of segments of the two operands (e.g., pairs of operand segments), each having a second precision, which may be a smaller precision than the first precision.

As shown in FIG. 5, restructured adder 160 may include a separate decoder 120 for each pair of operand segments. For example, the restructured adder 160 may include a first decoder 120 configured to decode a generate signal and/or a propagate signal resulting from a first pair of operand segments AA[31:0] and BB[31:0] (e.g., G1 and P1, respectively), a second decoder 120 configured to decode a generate signal and/or a propagate signal resulting from a second pair of operand segments AA[63:32] and BB[63:32] (e.g., G2 and P2, respectively), and a third decoder 120 configured to decode a generate signal and/or a propagate signal resulting from a third pair of operand segments AA[95:64] and BB[95:64] (e.g., G3 and P3, respectively). While not shown, each of the first, second, and third pairs of operand segments may route from first input circuitry and second input circuitry of the restructured adder 160 implemented to receive the first operand (AA) and the second operand (BB), respectively.

Further, as discussed above, the generate signal and propagate signal decoded at each decoder 120 are generated independently from the other generate and propagate signals and also independently from the value of the other pairs of operand segments. Accordingly, the decoders 120 and/or the operand segments input to a respective decoder 120 may be placed on the integrated circuit device 12 in areas separate and remote from one another instead of within a contiguous area. As such, fitting the restructured adder 160 onto integrated circuit device 10 may be less cumbersome than fitting the pipelined adder 100 of FIG. 5.

Still referring to FIG. 5, the generate and propagate signals from each decoder 120 may feed into a prefix network 162 (e.g., a soft logic prefix network). Prefix network 162 may be constructed out of combinatorial logic (e.g., combinatorial circuitry), and the layout of the prefix network 162 may be flexible. Accordingly, in some embodiments, prefix network 162 may be implemented with a Kogge-Stone topology, a Brent-Kung topology, a Sklansky topology, a pipelined topology, and/or any other suitable topology.

In any case, prefix network 162 may receive the generate and propagate signals from a decoder 120 as inputs and generate a corresponding carry bit. The restructured adder 160 may feed the generated carry bit into an input of a sub-adder 102 implemented to sum the pair of operand segments following (e.g., having an immediately more significant bit position) the pair of operand segments input to the decoder 120 responsible for producing the generate and propagate signals corresponding to the carry bit. For example, the prefix network 162 may generate the respective carry-out bit corresponding to each of the summations performed by the sub-adders 102 and may route the carry-out bit to the carry-in position of a respective subsequent sub-adder 102. Accordingly, the restructured adder 160 may mimic the carry-chain used by the pipelined adder 100 to feed each carry-out bit from a preceding sub-adder 102 to a following sub-adder 102 using the prefix network 162.

In some embodiments, to ensure a pair of operand segments are available at a final sub-adder 102 of the restructured adder 160 concurrently with the corresponding carry-out bit generated by the prefix network 162, the restructured adder 160 may include a delay chain 106 implemented to delay the pair of operand segments a suitable number of clock cycles to compensate for any pipelining implemented in the topology of the prefix network 162. In such embodiments, each of the delay chains 106 included in the restructured adder 160 may implement the same delay (e.g., the same number of clock cycles). Further, because the addition of the least significant pair of operand segments (e.g., AA[31:0] and BB[31:0]) does not include a carry-in, the sum of the least significant pair of operand segments may be implemented by delaying production of the least significant generate signal. Moreover, in some embodiments, the restructured adder 160 may be implemented such that an equivalent number of cycles of latency are applied to each pair of operand segments input to the restructured adder 160.

Although restructured adder 160 may appear more complex than pipelined adder 100, the depth (e.g., number of stages and/or latency) of the restructured adder 160 may remain relatively constant, regardless of the precision of the restructured adder 160. For example, a restructured adder 160 with a precision of 1024-bits may include a wider (e.g., higher precision) prefix network 162 than the illustrated embodiment of the restructured adder 160, which has a precision of 128-bits, but because the prefix network 162 may be constructed with combinatorial logic, increasing the width (e.g., precision) of the prefix network 162 may not increase the depth and/or the latency of the restructured adder 160. Accordingly, the depth of the delay chains 106 used at the output of the prefix network 162 may remain the same between the restructured adder 160 with the precision of 1024-bits and the illustrated restructured adder 160. The depth of the pipelined adder 100, on the other hand, may increase by one with each additional sub-adder 102 used to sum each additional pair of operand segments, as the pipelined adder 100 may include an additional stage of pipelining (e.g., carry-chain). Accordingly, the latency produced by the delay chains 106 of the pipelined adder 100 may increase as the precision of the pipelined adder 100 increases.

Figure 6:
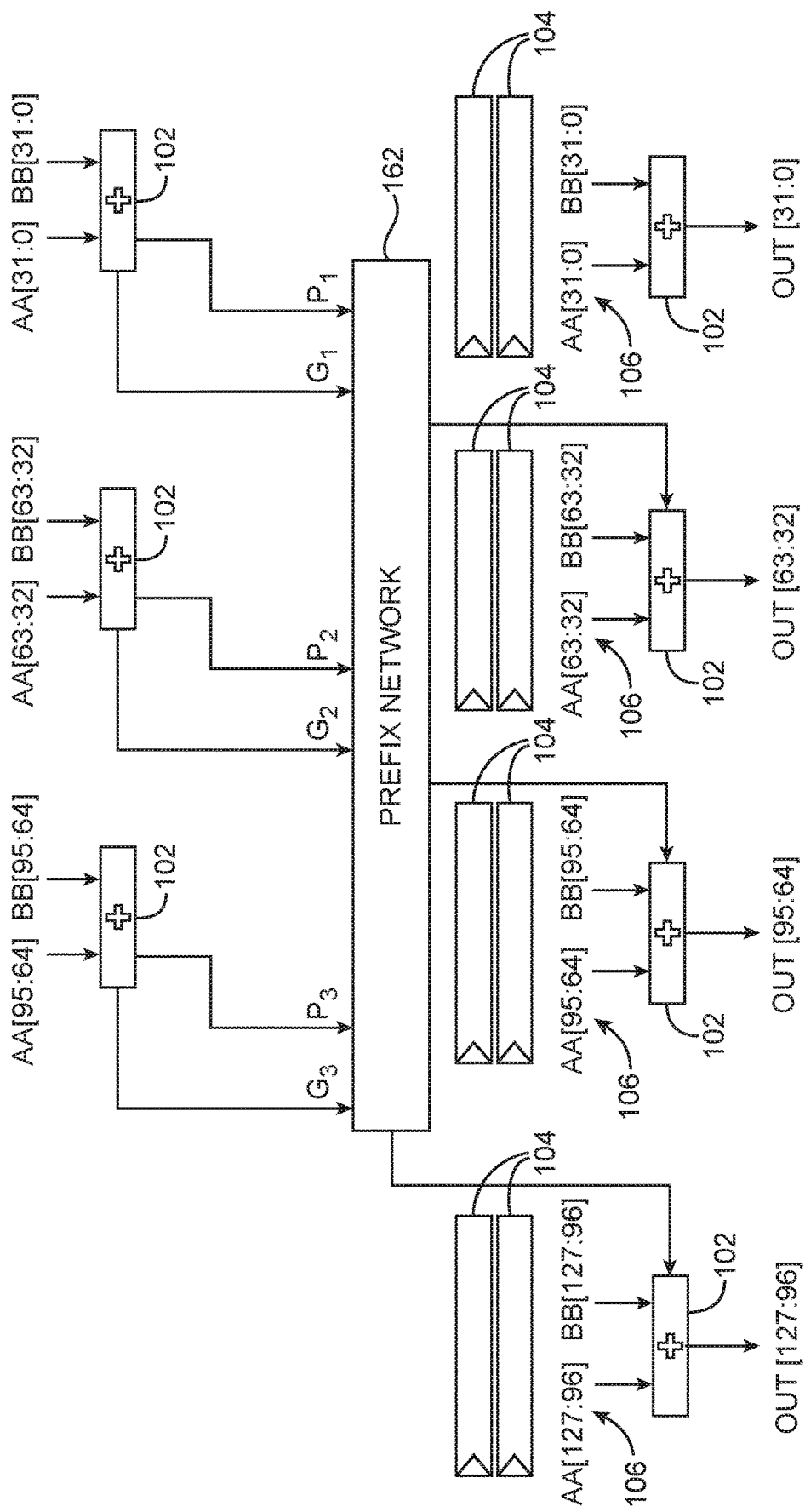
FIG. 6 is a diagram of a restructured adder that includes sub-adders configured to concurrently output generate and propagate signals.

Further, in some embodiments, calculating the generate signal (G) and the propagate signal (P) separately (e.g., with a pair of sub-adders 102 in decoder 120) may consume significant resources (e.g., area, routing, power, and/or the like) on the integrated circuit device. For example, the value 3N may represent the arithmetic cost of a large, N-bit adder such as the restructured adder 160 of FIG. 5. However, by simultaneously calculating the generate signal and the propagate signal, the arithmetic cost of the N-bit adder may be reduced to 2N, which may result in significant resource (e.g., placement and routing, area, and/or the like) and/or performance (e.g., latency) benefits of the integrated circuit device. Accordingly, in some embodiments, decoder 120 may be restructured to concurrently output the generate signal and the propagate signal, as illustrated in FIG. 6. As shown in FIG. 6, each sub-adder 102 that receives a pair of operand segments can compute and output propagate and generate signals in parallel.

Figure 7:
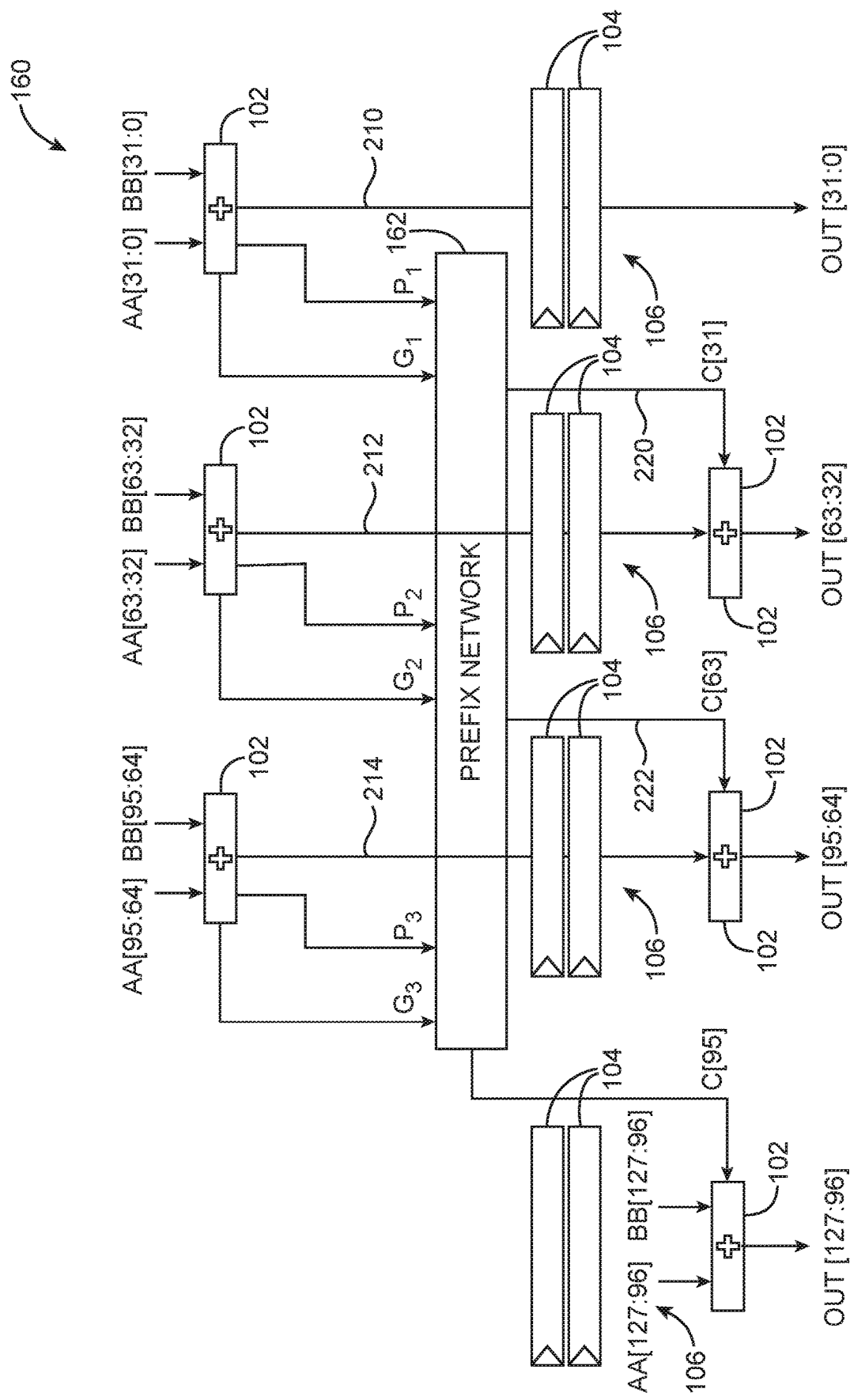
FIG. 7 is a diagram of a restructured adder that includes sub-adders configured to concurrently output generate, propagate, and sum signals.

Moreover, as illustrated in FIG. 7, in some embodiments, each of the propagate signal, the generate signal, and a sum may be computed concurrently within the sub-adder 102. Accordingly, in such embodiments, the sum of a pair of operand segments may be pipelined directly to a corresponding final sub-adder 102. For example, restructured adder 160 may route the sum generated by the first (top right) sub-adder 102 to bypass the prefix network 162 via routing path 210 and serve as the first output segment OUT[31:0].

The restructured adder 160 may route the sum generated by the second (top center) sub-adder 102 to bypass the prefix network 162 and serve as an input, along with the carry-in value C[31] determined by the prefix network 162, to the final sub-adder 102 via bypass path 220. Carry signal C[31] may be dependent on signals G1 and P1 output from first sub-adder 102. As such, the corresponding final sub-adder 102 below may add the sum generated by the second sub-adder 102 with carry-in value C[31] to generate the second output segment OUT[63:32].

Similarly, the restructured adder 160 may route the sum generated by the third (top left) sub-adder 102 to bypass the prefix network 162 and serve as an input, along with the carry-in value C[63] determined by the prefix network 162, to the final sub-adder 102 via bypass path 222. Carry signal C[63] may be dependent on signals G2 and P2 output from second sub-adder 102. As such, the corresponding final sub-adder 102 below may add the sum generated by the third sub-adder 102 with carry-in value C[65] to generate the third output segment OUT[95:64]. The last output segment OUT[127:96] may be generated in a similar fashion.

Restructured adder 160 of FIG. 7 may also include a delay chain 106 in each of the sum bypass paths (e.g., paths 210, 212, and 214) to delay the segment sums a suitable number of clock cycles to compensate for any pipelining delay in the topology of prefix network 162. In such embodiments, each of the delay chains 106 included in the restructured adder 160 may implement the same delay, which is equal to two clock cycles in the example of FIG. 7. Configured and operated in this way, the restructured adder 160 of FIG. 7 may be implemented with reduced routing compared to the embodiments of FIGS. 5-6, which may result in a more efficient integrated circuit device 10.

As described above, adder 160 of the type shown in FIGS. 5-7 may be used to sum together two large input signals AA and BB. In accordance with an embodiment, these adder structures may be arranged as part of a larger adder tree network that is capable of summing together more than two very large inputs (e.g., an adder tree structure that can be used to combine four very large integers, six very large integers, eight very large integers, 16 very large integers, 32 very large integers, 64 very large integers, or any suitable number of very large integers with hundreds or thousands of bits). The adder network may be formed using a tree of individual adder circuit units or blocks sometimes referred to herein as "adder nodes."

Figure 8A:
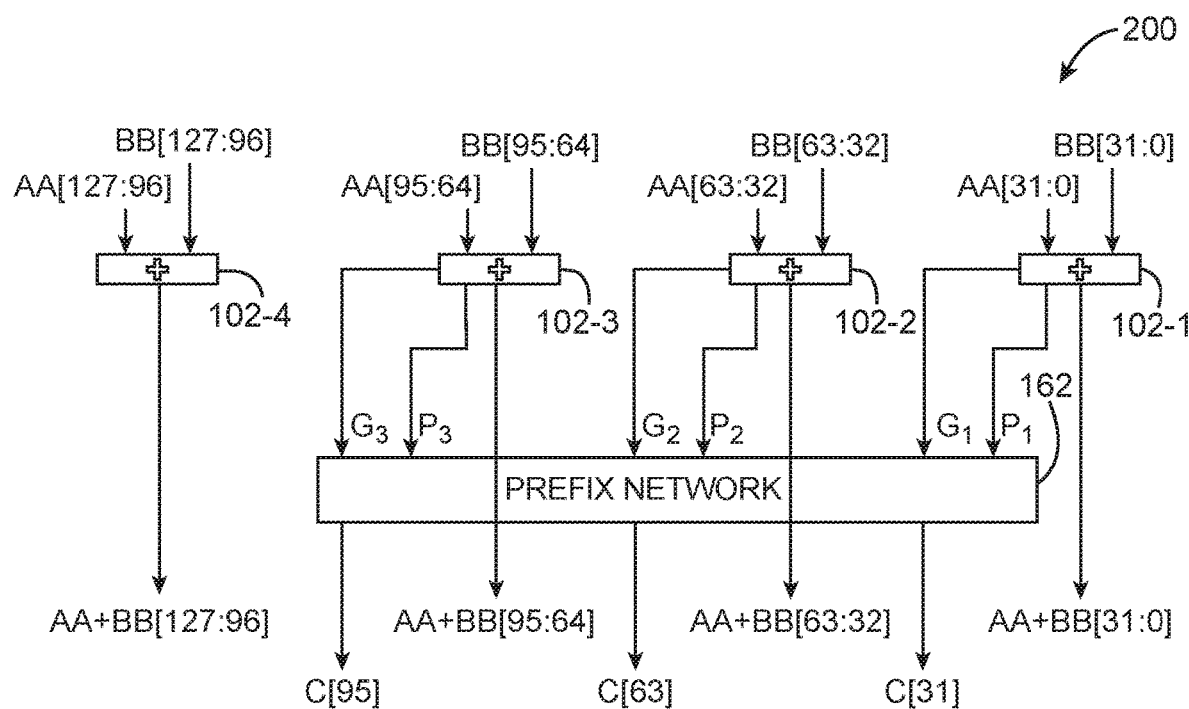
FIGS. 8A and 8B are diagrams of an illustrative adder node in accordance with an embodiment.

FIG. 8A is a diagram of an adder node circuit such as adder node 200. Adder node 200 does not include all of adder 160 of FIG. 7. As shown in FIG. 8A, adder node 200 includes only the circuitry that is used to generate the carry signals (e.g., prefix network 162 configured to generate carry bits C[31], C[63], and C[95]) and the sums for each pair of operand segments (e.g., a first sub-adder 102-1 configured to generate AA+BB[31:0], a second sub-adder 102-2 configured to generate AA+BB[63:32], a third sub-adder 102-3 configured to generate AA+BB[95:64], and a fourth sub-adder 102-4 configured to generate AA+BB[127:96]). Adder node 200 itself need not include the final sub-adders 102 for combining the segment sums with the associated carry bits to generate the output segment bits OUT (see bottom half portion of FIG. 7).

Figure 8B:
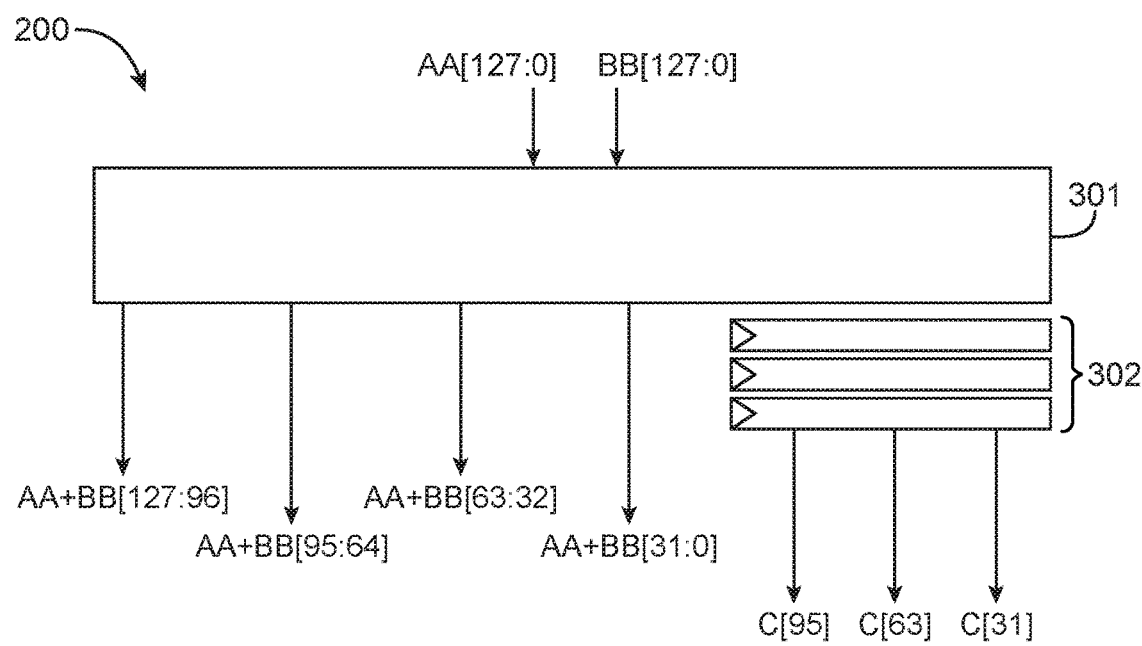

Adder node 200 of FIG. 8A may be abstracted as shown in FIG. 8B. Block 301 of adder node 200 may include all the circuitry configured to receive input bits AA[127:0] and BB[127:0] and to output first segment sum AA+BB[31:0], second segment sum AA+BB[63:32], third segment sum AA+BB[95:64], and fourth segment sum AA+BB[127:96]. Generation of these segment sums may be completed by sub-adders 102 in one clock cycle, whereas generation of the associated carry bits could be three or more clock cycles caused by the additional delay of the prefix network (as represented by additional delay elements 302 in FIG. 8B).

The example of FIGS. 8A and 8B where adder node 200 divides the inputs into four segments and generates four corresponding segment sums and three carry bits is merely illustrative and is not intended to limit the scope of the present embodiments. In general, adder node 200 may organize large input numbers into any number of segments (e.g., two or more segments, four or more segments, 2-8 segments, 8-16 segments, 16-32 segments, 32-64 segments, or more than 64 segments), and the prefix network within adder node 200 may generate one fewer carry bits than the total number of segments since the carry out of the highest segment can be ignored. For example, an adder node 200 that generates eight sum segments will also generate seven associated carry bits. As another example, an adder node 200 that generates 16 sum segments will also generate 15 associated carry bits.

Figure 9:
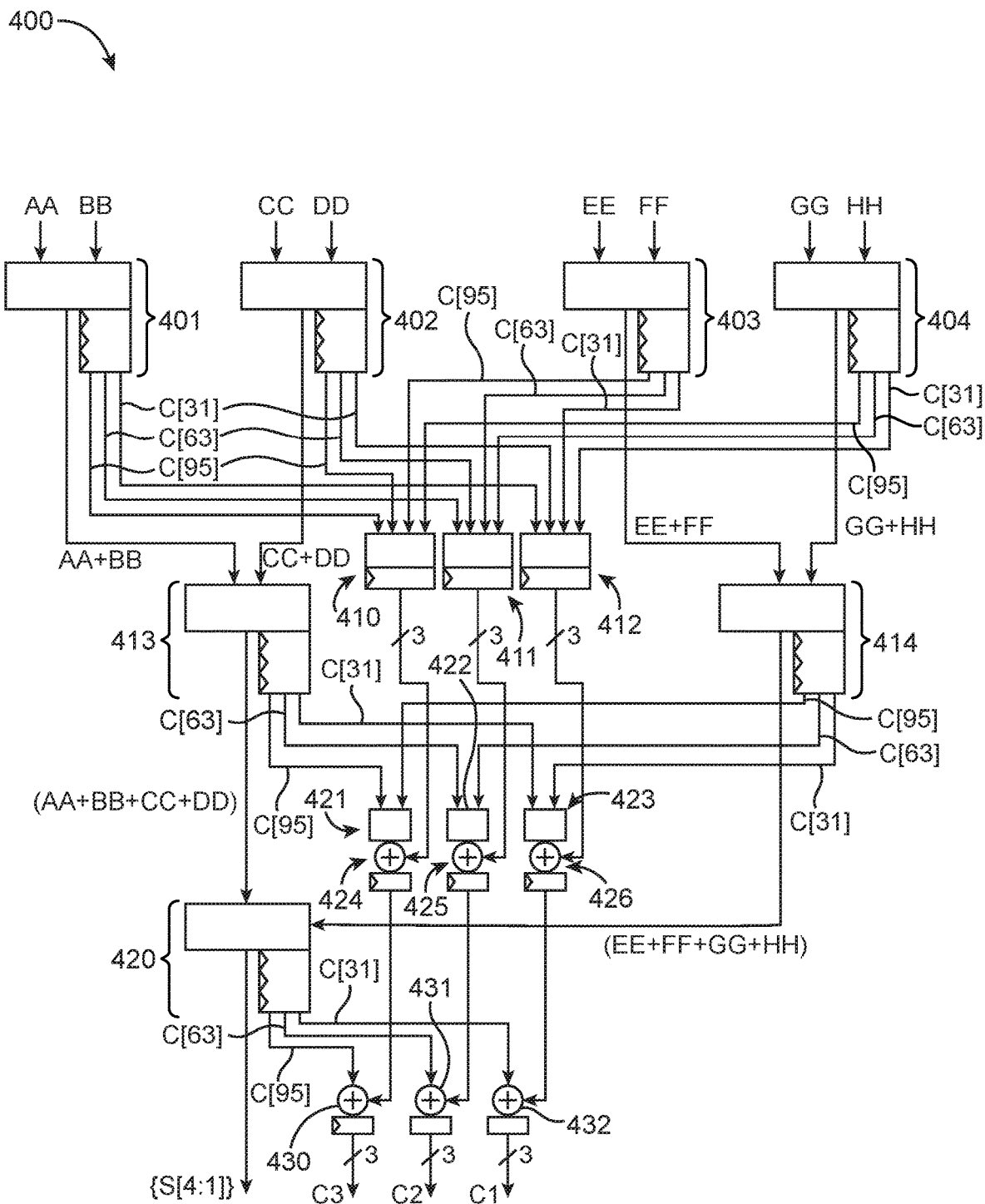
FIG. 9 is a diagram of an illustrative adder tree that includes multiple stages of adder nodes in accordance with an embodiment.

FIG. 9 is a diagram of illustrative adder tree circuitry 400 that includes multiple stages of adder nodes. As shown in FIG. 9, adder tree network 400 may include a first level/stage of adder nodes 401-404, a second level/stage of adder nodes 413-414, and a third level/stage having only adder node 420. These adder nodes 401-404, 413-414, and 420 may have the same structure and function as adder node 200 described in connection with FIGS. 8A and 8B. Adder node 401 may be configured to receive very large input signals AA and BB; adder node 402 may be configured to receive very large input signals CC and DD; adder node 403 may be configured to receive very large input signals EE and FF; and adder node 404 may be configured to receive very large input signals GG and HH. Assuming (for example) that each of inputs AA, BB, CC, DD, EE, FF, GG, and HH are 128 bits and that each node breaks the input bits into four separate segments, each of the adder nodes in the first tree level may also output carry bits C[31], C[63], and C[95].

Adder nodes 401-404 in the first tree level compute segment sums and carry bits in parallel. The segment sums feed directly to the next level in adder tree 400 while maintaining the same segment index. For example, the segment sums of AA+BB from node 401 and the segment sums of CC+BB from node 402 will be provided as inputs directly to adder node 413 in the second tree level. Similarly, the segment sums of EE+FF from node 403 and the segment sums of GG+HH from node 404 will be provided as inputs directly to adder node 414 in the second tree level.

The carry bits, on the other hand, are handled and summed separately. The carry bits output from the first tree level (or any tree level in general) may be grouped by segment index and counted. In the example of FIG. 9, carry bits C[95] from adder nodes 401-404 may be fed to a first population counter 410 configured to count the number of high carry bits output by the third segment associated with input indices [95:64]; carry bits C[63] from adder nodes 401-404 may be fed to a second population counter 411 configured to count the number of high carry bits output by the second segment associated with input indices [63:32]; and carry bits C[31] from adder nodes 401-404 may be fed to a third population counter 412 configured to count the number of high carry bits output by the first segment associated with input indices [31:0]. Since there are four adder nodes in the first tree level, the output of counters 410-412 may be at least three bits wide to encode a maximum value of four in the exemplary adder tree 400 of FIG. 9.

Adder nodes 413-414 in the second tree level also compute segment sums and carry bits in parallel. The segment sums feed directly to the next level in adder tree 400 while maintaining the same segment index. For example, the segment sums of AA+BB+CC+DD from node 413 and the segment sums of EE+FF+GG+HH from node 414 will be provided as inputs directly to adder node 420 in the third tree level.

The carry bits, on the other hand, are handled and summed separately. The carry bits output from the second tree level may be grouped by segment index and tallied. In the example of FIG. 9, carry bits C[95] from adder nodes 413 and 414 may be fed to a fourth population counter 421 configured to count the number of high carry bits output by the third segment associated with input indices [95:64]; carry bits C[63] from adder nodes 413 and 414 may be fed to a fifth population counter 422 configured to count the number of high carry bits output by the second segment associated with input indices [63:32]; and carry bits C[31] from adder nodes 413 and 414 may be fed to a sixth population counter 423 configured to count the number of high carry bits output by the first segment associated with input indices [31:0]. Since there are two additional adder nodes in the second tree level, the output of counters 421-423 may be at least three bits wide to encode a maximum value of six in the exemplary adder tree 400 of FIG. 9.

The carry count from the second tree level may be accumulated with the carry count from the first tree level using adders 424, 425, and 426. For example, adder 424 may be configured to sum together the values from counters 410 and 421, adder 425 may be configured to sum together the values from counters 411 and 422, and adder 426 may be configured to sum together the values from counters 412 and 423. Configured in this way, adders 424-426 may keep a total tally of high carry bits for each segment.

Adder node 420 in the third tree level may combine sum (AA+BB+CC+DD) provided from adder node 413 and sum (EE+FF+GG+HH) provided from adder node 414 to output a sum vector of four elements S[4:1]. Each of the elements in the sum vector S represent the cumulative sum for each segment. For instance, vector element S[4] represents the total sum for indices [127:96]; vector element S[3] represents the total sum for indices [95:64]; vector element S[2] represents the total sum for indices [63:32]; and vector element S[1] represents the total sum for indices [31:0].

The carry bits, like the previous levels in the tree, are handled and summed separately. The carry bits output from the third tree level may be grouped by segment index and accumulated with the carry total from the previous levels using adders 430, 431, and 432. For example, adder 430 may be configured to sum together C[95] output from node 420 with the value from adder 424 to compute carry total C3, adder 431 may be configured to sum together C[63] output from node 420 with the value from adder 425 to compute carry total C2, and adder 432 may be configured to sum together C[31] output from node 420 with the value from adder 426 to compute carry total C1. Configured in this way, adders 430-432 may keep a total tally of high carry bits for each segment. Since there is only one additional adder node in the third tree level, the output of adders 430-432 may be at least three bits wide to encode a maximum value of seven in the exemplary adder tree 400 of FIG. 9 (e.g., carry totals C1, C2, and C3 may each be at least three bits wide). The carry totals may be referred to collectively as a carry vector [C3:C1].

Note that although the delay of the carry computations is larger than the segment sum computations due to the additional latency through the prefix network, the total depth of the carry path through the tree only increases by one cycle per level (assuming the segment sum delay of each adder node is one clock cycle). Thus, for a large adder tree, since the carry vector is generated independently from the sum vector, the total delay of the carries will only be slightly larger than the adder reduction tree.

The example of FIG. 9 in which adder tree 400 includes three tree levels for summing together eight inputs is merely illustrative and is not intended to limit the scope of the present embodiments. In general, adder tree 400 may include any number of tree levels configured to sum together any number of very large integers. The final carry totals output from tree 400 will be some number of bits (e.g., $\log_2(\text{\# of inputs}) + \log_2(\text{\# of levels})$). In an example where there are 64 inputs, six tree levels are required, so each element in the carry vector may be up to 9 bits wide (i.e., $\log_2(64) + \log_2(6) = 9$)

Figure 10:
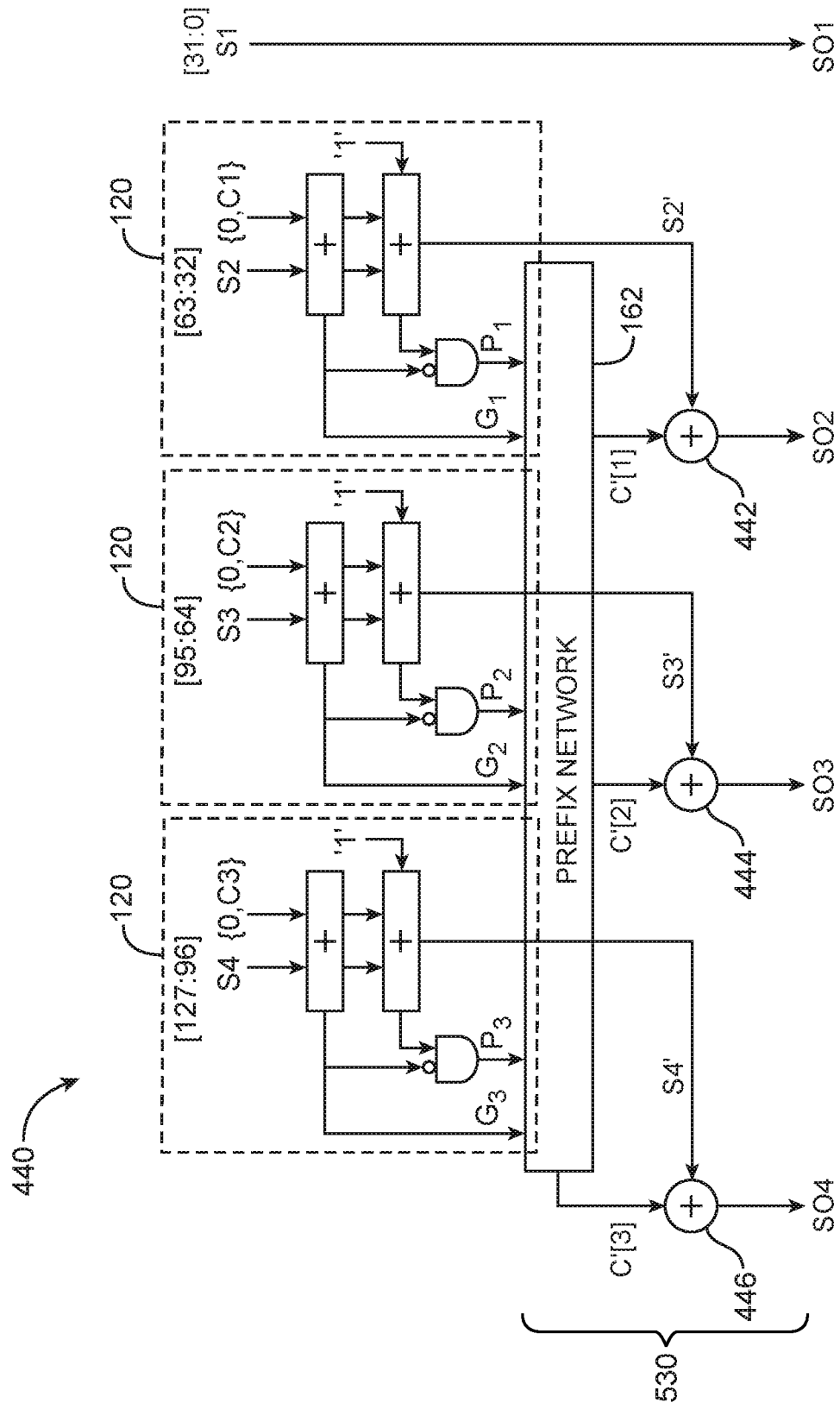
FIG. 10 is a diagram of a final adder stage configured to combine sum and carry bits in accordance with an embodiment.

The sum vector S[4:1] and the carry vector [C3:C1] output from adder tree network 400 may be using a final adder stage such as adder stage 440 of FIG. 10. As shown in FIG. 10, final adder stage 440 may be similar to adder 160 of FIG. 5. As shown in FIG. 10, sum vector element S1 can be passed directly to the output as final sum output element SO1. Sum vector element S2 can be combined with carry vector element C1 (padded with zeros at the most significant bits) using first decoder 120 to generate sum S2', generate signal G1, and propagate signal P1. Signals G1 and P1 can be combined using prefix network 162 to output carry C'[1], which can then be summed with S2' using adder 442 to generate final sum output element SO2.

Sum vector element S3 can be combined with carry vector element C2 (padded with zeros at the MSBs) using second decoder 120 to generate sum S3', generate signal G2, and propagate signal P2. Signals G2 and P2 can be combined using prefix network 162 to output carry C'[2], which can then be summed with S3' using adder 444 to generate final sum output element SO3. Similarly, sum vector element S4 can be combined with carry vector element C3 (padded with zeros at the MSBs) using third decoder 120 to generate sum S4', generate signal G3, and propagate signal P3. Signals G3 and P3 can be combined using prefix network 162 to output carry C'[3], which can then be summed with S4' using adder 446 to generate final sum output element SO4. Elements [SO4:SO1] generated in this way represent the final sum output.

Since all the adder nodes in the tree includes one stage of segment adders (see, e.g., FIG. 7 where generate and propagate signals can be output using a single sub-adder 102) or two stages of segment adders (see, e.g., FIG. 5 where generate and propagate signals are output using two sub-adders 102), the overall size of the large adder circuitry is approximately the same as if it were built out of ripple carry adders plus a single large adder core (e.g., adder core 440 of FIG. 10), which is significantly smaller and faster than conventional adder architectures for adding together a large number of very large integers.

Figure 11A:
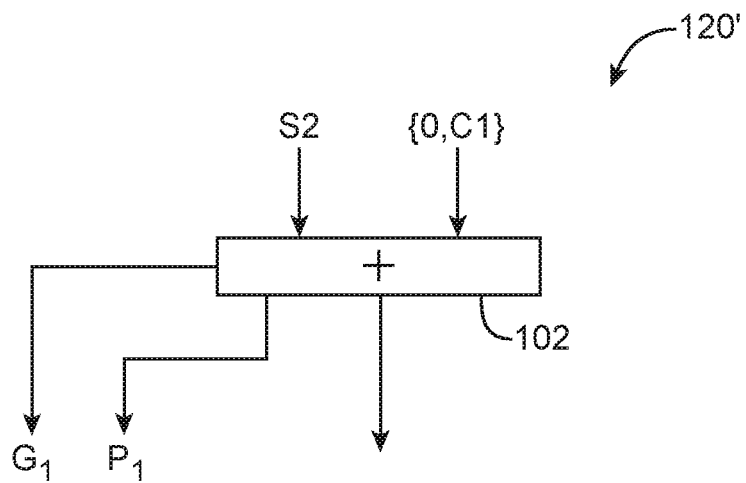
FIGS. 11A and 11B show different implementations of an illustrative sub-adder that can be used to output generate, propagate, and sum signals in the final adder stage of FIG. 10 in accordance with an embodiment.
Figure 11B:
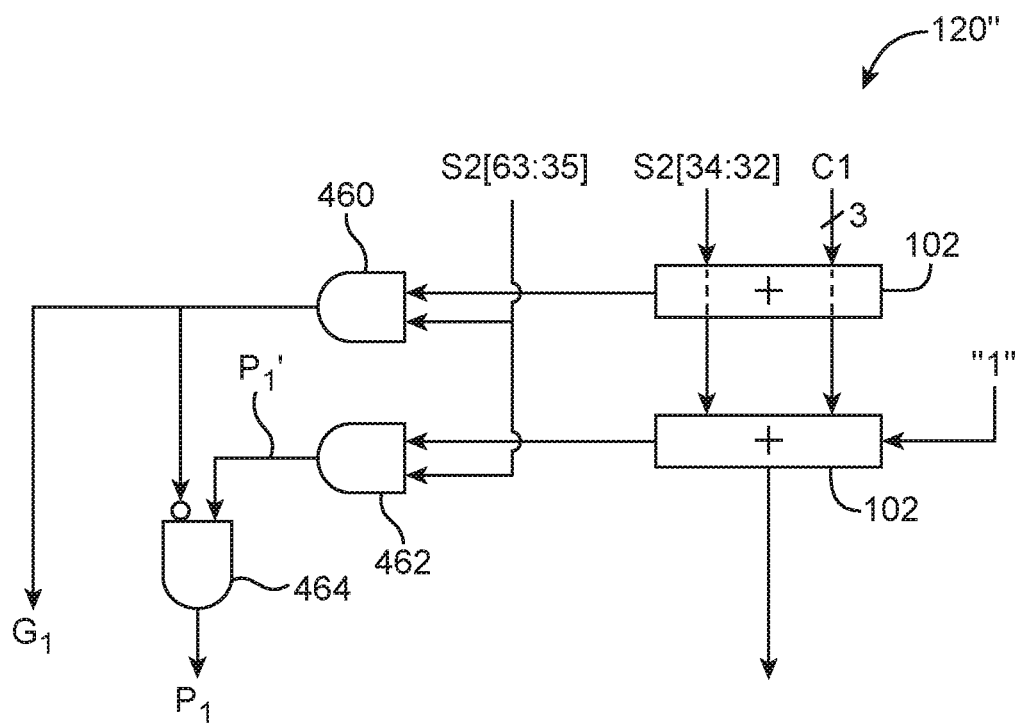

If desired, the final adder stage 440 may be further optimized. FIGS. 11A and 11B show different implementations of decoder 120 that can be used to output generate, propagate, and sum signals in final adder stage 440. In the example of FIG. 11A, decoder 120' includes a single sub-adder 102 that is capable of concurrently outputting the propagate signal, the generate signal, and the sum. This is similar to the sub-adders shown in FIG. 7.

The carry signal is usually much shorter than the segment size, so a full adder length is not necessarily required to compute the generate and propagate bits. FIG. 11B shows an improved decoder 120" that implements a short addition to adder the carry signal with a subset of the sum segment. The remaining upper bits can be calculated with a logic AND gate. As shown in FIG. 11B, a first sub-adder 102

To decode the generate signal, decoder 120" may, using a first sub-adder 102, compute a carry-out signal resulting from the sum of C1 and the lower bits of S2. The carry-out signal of the first sub-adder 102 may be ANDed with the remaining MSBs of S2 using logical AND gate 460 to compute the corresponding generate signal G1. To decode the propagate signal, decoder 120" may, using a second sub-adder 102, compute a carry-out signal resulting from the sum of C1, the lower bits of S2, and a carry-in value of "1". The carry-out signal of the second sub-adder 102 may be ANDed with the remaining MSBs of S2 using logical AND gate 462 to compute signal P1'. Signal P1' may be combined with an inverted version of G1 using logic AND gate 464 to compute propagate signal P1. Configured in this way, gate 464 computes the logical function: NOT(G) AND P'. Using decoder 120" in final adder stage 440 can save circuit area while minimizing power consumption.

Figure 12:
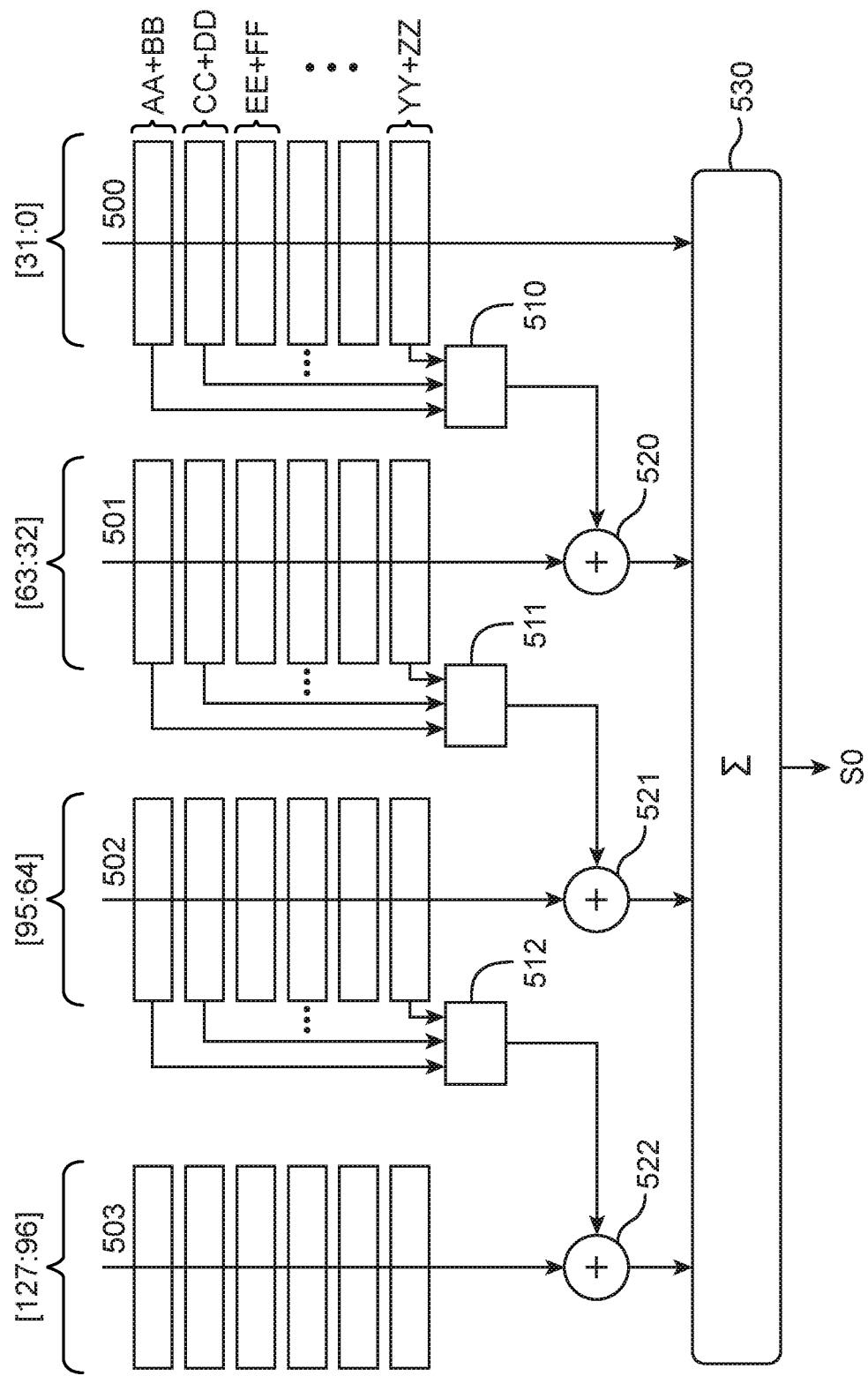
FIG. 12 is a diagram of a logical representation of an adder tree of the type shown in FIG. 9 in accordance with an embodiment.

FIG. 12 illustrates a logical representation of adder tree 400 with the final adder stage 440. As shown in FIG. 12, all segments associated with the same index are added together without consideration of the carry overflow. For example, vector or pipeline 500 represents summing all the segments associated with indices [31:0]; vector or pipeline 501 represents summing all the segments associated with indices [63:32]; vector or pipeline 502 represents summing all the segments associated with indices [95:64]; and vector/pipeline 503 represents summing all the segments associated with indices [127:96]. The different rows corresponding to different input operand pairs.

As shown in FIG. 12, the carry overflow can be computed independently from the sum segments. For example, block or pipeline 510 represents summing all of the carry bits C[31]; block or pipeline 511 represents summing all of the carry bits C[63]; and block/pipeline 512 represents summing all of the carry bits C[95]. Adder circuits 520, 521, 522, and 530 represent the circuitry within the final adder stage 440 of FIG. 10. In particular, adder 520 may represent the first decoder that combines S2 and C1, adder 521 may represent the second decoder that combines S3 and C2, and adder 522 may represent the third decoder that combines S4 and C3. Summation block 530 may represent prefix network 162 and adder circuits 442, 444, and 446 for computing the final sum output SO.

While the techniques described above reference adder nodes configured to receive 128-bit inputs, which include four 32-bit sub-adders 102 pipelined together, each adder node in the larger tree network may optionally be implemented with larger precision, such as a 1024-bit adder node and/or another suitable size. In such cases, the adder node may be decomposed into a greater number of sub-adders 102, such as thirty-two 32-bit sub-adders 102. Additionally or alternatively, the precision of the operand segments and/or the sub-adders 102 may be increased or decreased, and in some embodiments, the precision of the operand segments and/or the sub-adders 102 may be determined based in part on the precision of integrated circuit device 10. In any case, examples described herein are intended to be illustrative, and not limiting.

Figure 13:
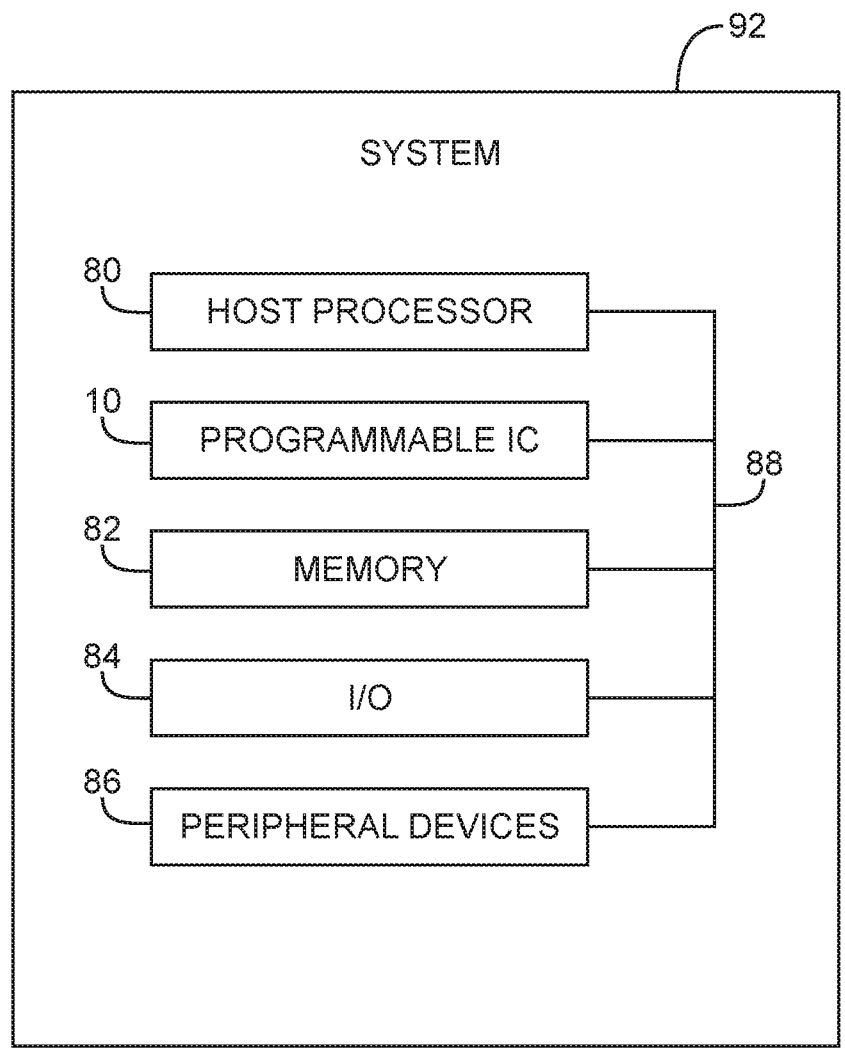
FIG. 13 is a diagram of a data processing system in accordance with an embodiment.

FIG. 13 is a diagram of a data processing system in accordance with an embodiment. The integrated circuit device 10 that includes very large adder circuitry of the type described in connection with FIGS. 1-12 may be, or may be a component of, a data processing system. For example, integrated circuit device 10 may be a component of a data processing system 92 shown in FIG. 13. Data processing system 92 may include a host processor 80, memory and/or storage circuitry 82, input-output (I/O) circuitry 84, and peripheral devices 86. These components are coupled together by a system bus 88.

Data processing system 92 may include more or fewer components (e.g., electronic display, user interface structures, application specific integrated circuits (ASICs)). Host processor 80 may include any suitable processor, such as an INTEL® Xeon® processor or a reduced-instruction processor (e.g., a reduced instruction set computer (RISC), an Advanced RISC Machine (ARM) processor, etc.) that may manage a data processing request for data processing system 92 (e.g., to perform encryption, decryption, machine learning, video processing, voice recognition, image recognition, data compression, database search ranking, bioinformatics, network security pattern identification, spatial navigation, or the like).

The memory and/or storage circuitry 82 may include random access memory (RAM), read-only memory (ROM), one or more hard drives, flash memory, or any suitable type of computer-readable media for storing data, program code, or other data to be processed by data processing system 92. In some cases, the memory and/or storage circuitry 82 may also store configuration programs (bitstreams) for programming integrated circuit device 10. Input-output devices 84, peripheral devices 86, and other network interface components may allow data processing system 92 to communicate with other electronic devices. Data processing system 320 92 include several different packages or may be contained within a single package on a single package substrate.

In one example, data processing system 92 may be part of a data center that processes a variety of different requests. For instance, data processing system 92 may receive a data processing request to perform encryption, decryption, machine learning, video processing, voice recognition, image recognition, data compression, database search ranking, bioinformatics, network security pattern identification, spatial navigation, or some other specialized task. The host processor 80 may cause the programmable logic fabric of device 10 to be programmed with an adder suitable to implement a requested task. For instance, host processor 80 may instruct that configuration data (bitstream) stored on memory and/or storage circuitry 82 to be programmed into the programmable logic fabric of device 10. The configuration data (bitstream) may represent a circuit design for a large adder, such adder tree 400, which may be mapped to the programmable logic according to the techniques described herein, to efficiently perform and/or compute the requested task.

As other examples, system 92 may also be a computer networking system, a data networking system, a digital signal processing system, a graphics processing system, a video processing system, a computer vision processing system, a cellular base station, a virtual reality or augmented reality system, a network functions virtualization platform, an artificial neural network, an autonomous driving system, a combination of at least some of these systems, and/or other suitable types of computing systems.

EXAMPLES

The following examples pertain to further embodiments.

Example 1 is adder circuitry, comprising a plurality of adder node circuits coupled together in a tree-like arrangement, wherein the adder node circuits are configured to: receive input signals; separate the input signals into different segments; compute sums for the different segments; and compute carries for at least some of the segments, wherein the carries are computed independently from the sums.

Example 2 is the adder circuitry of example 1, wherein each of the input signals includes at least 100 bits.

Example 3 is the adder circuitry of example 1, wherein each of the input signals includes at least 1000 bits.

Example 4 is the adder circuitry of any one of examples 1-3, wherein each of the adder node circuits is configured to separate the input signals into N different segments and is further configured to output (N−1) carries.

Example 5 is the adder circuitry of any one of examples 1-4, wherein each of the adder node circuits comprises: decoder circuits configured to output generate and propagate signals; and a prefix network configured to receive the generate and the propagate signals from the decoder circuits and to compute the corresponding carries.

Example 6 is the adder circuitry of any one of examples 1-5, wherein the carries are computed after the sums have been computed.

Example 7 is the adder circuitry of any one of examples 1-6, further comprising counter circuits configured to tally the number of carries received from different adder node circuits in the plurality of adder node circuits.

Example 8 is the adder circuitry of any one of examples 1-7, wherein the plurality of adder node circuits is configured to output a sum vector and a carry vector.

Example 9 is the adder circuitry of example 8, further comprising a final adder stage configured to combine the sum vector and the carry vector.

Example 10 is the adder circuitry of example 9, wherein the final adder stage comprises: decoder circuits configured to output generate and propagate signals and sum signals; and a prefix network configured to receive the generate and the propagate signals from the decoder circuits and to compute additional carry signals.

Example 11 is the adder circuitry of example 10, wherein the final adder stage further comprises adders configured to receive the additional carry signals from the prefix network and the sum signals from the decoder circuits to generate a final sum output.

Example 12 is the adder circuitry of example 10, wherein each of the decoder circuits includes two sub-adders and a logic gate configured to output the generate and propagate signals.

Example 13 is the adder circuitry of example 10, wherein each of the decoder circuits includes a single sub-adder configured to concurrently output the generate and propagate signals.

Example 14 is the adder circuitry of example 10, wherein at least one of the decoder circuits is configured to receive a carry element from the carry vector and a sum element from the sum vector, wherein the at least one of the decoder circuits comprises a sub-adder that receives the carry element and a first subset of the sum element, and wherein the at least one of the decoder circuits further comprises a logic gate configured to receive a carry out from the sub-adder and a second subset of the sum element that is non-overlapping with the first subset.

Example 15 is adder circuitry, comprising: a tree of adder nodes, wherein a first level in the tree comprises first adder nodes configured to receive input operands, to separate the input operands into segments, and to compute sums for each of the segments in parallel, wherein the first adder nodes are further configured to output carry bits for a subset of the segments.

Example 16 is the adder circuitry of example 15, further comprising counters configured to tally the total number of high carry bits output from the first adder nodes.

Example 17 is the adder circuitry of example 16, wherein a second level in the tree comprises second adder nodes configured to receive the sums from the first level, wherein the second adder nodes are further configured to output additional carry bits.

Example 18 is the adder circuitry of example 17, further comprising: additional counters configured to tally the total number of high carry bits output from the second adder nodes; and adders configured to sum together values output from the counters and the additional counters.

Example 19 is adder circuitry, comprising: a first segment pipeline configured to output a first segment sum; a second segment pipeline configured to output a second segment sum; a first carry pipeline configured to output a first carry signal independently of the computation of the first segment sum; a second carry pipeline configured to output a second carry signal independently of the computation of the second segment sum; and summing circuits configured to combine the first segment sum, the second segment sum, the first carry signal, and the second carry signal to generate a final sum output.

Example 20 is the adder circuitry of example 19, wherein the summing circuits comprises: decoder circuits configured to receive the first segment sum, the second segment sum, the first carry signal, and the second carry signal and to output corresponding generate and propagate signals; and a prefix network configured to receive the generate and propagate signals from the decoder circuits, wherein the prefix network comprises a Kogge-Stone topology, a Brent-Kung topology, a Sklansky topology, or a combination thereof.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. Adder circuitry, comprising:
a plurality of adder circuits coupled together in a tree-like arrangement having a first level with a first number of the adder circuits and a second level with a second number of the adder circuits that is less than the first number, wherein the adder circuits are configured to:
receive input signals;
separate the input signals into different segments;
compute sums for the different segments; and
compute carries for at least some of the segments, wherein the sums output from the second level are computed independently from the carries output from the first level.

2. The adder circuitry of claim 1, wherein each of the input signals includes at least 100 bits.

3. The adder circuitry of claim 1, wherein each of the input signals includes at least 1000 bits.

4. The adder circuitry of claim 1, wherein each of the adder circuits is configured to separate the input signals into N different segments and is further configured to output (N−1) carries.

5. The adder circuitry of claim 1, wherein each of the adder circuits comprises:
decoder circuits configured to output generate and propagate signals; and
a prefix network configured to receive the generate and the propagate signals from the decoder circuits and to compute the corresponding carries.

6. The adder circuitry of claim 1, wherein the carries are computed after the sums have been computed.

7. The adder circuitry of claim 1, further comprising counter circuits configured to tally the number of carries received from different adder circuits in the plurality of adder circuits.

8. The adder circuitry of claim 1, wherein the plurality of adder circuits is configured to output a sum vector and a carry vector.

9. The adder circuitry of claim 8, further comprising:
a final adder stage configured to combine the sum vector and the carry vector.

10. The adder circuitry of claim 9, wherein the final adder stage comprises:
decoder circuits configured to output generate and propagate signals and sum signals; and
a prefix network configured to receive the generate and the propagate signals from the decoder circuits and to compute additional carry signals.

11. The adder circuitry of claim 10, wherein the final adder stage further comprises:
adders configured to receive the additional carry signals from the prefix network and the sum signals from the decoder circuits to generate a final sum output.

12. The adder circuitry of claim 10, wherein each of the decoder circuits includes two sub-adders and a logic gate configured to output the generate and propagate signals.

13. The adder circuitry of claim 10, wherein each of the decoder circuits includes a single sub-adder configured to concurrently output the generate and propagate signals.

14. The adder circuitry of claim 10, wherein at least one of the decoder circuits is configured to receive a carry element from the carry vector and a sum element from the sum vector, wherein the at least one of the decoder circuits comprises a sub-adder that receives the carry element and a first subset of the sum element, and wherein the at least one of the decoder circuits further comprises a logic gate configured to receive a carry out from the sub-adder and a second subset of the sum element that is non-overlapping with the first subset.

15. Adder circuitry, comprising:
a tree of adder nodes, wherein a first level in the tree comprises first adder nodes configured to receive input operands, to separate the input operands into segments, and to compute sums for each of the segments in parallel, wherein the first adder nodes are further configured to output carry bits for a subset of the segments; and counters configured to tally the total number of high carry bits output from the first adder nodes.

16. The adder circuitry of claim 15, wherein a second level in the tree comprises:
second adder nodes configured to receive the sums from the first level, wherein the second adder nodes are further configured to output additional carry bits.

17. The adder circuitry of claim 16, further comprising:
additional counters configured to tally the total number of high carry bits output from the second adder nodes; and
adders configured to sum together values output from the counters and the additional counters.

18. Adder circuitry, comprising:
a first carry pipeline configured to output a first carry signal;
a second carry pipeline configured to output a second carry signal;
a first segment pipeline configured to output a first segment sum independently from the computation of the first carry signal;
a second segment pipeline configured to output a second segment sum independently from the computation of the second carry signal; and
summing circuits configured to combine the first segment sum, the second segment sum, the first carry signal, and the second carry signal to generate a final sum output.

19. The adder circuitry of claim 18, wherein the summing circuits comprises:
decoder circuits configured to receive the first segment sum, the second segment sum, the first carry signal, and the second carry signal and to output corresponding generate and propagate signals; and
a prefix network configured to receive the generate and propagate signals from the decoder circuits, wherein the prefix network comprises a Kogge-Stone topology, a Brent-Kung topology, a Sklansky topology, or a combination thereof.

20. The adder circuitry of claim 18, wherein the first and second pipelines comprise a tree of adder circuits having a first number of adder circuits in a first level of the tree and a second number of adder circuits in a second level of the tree, and wherein the first number of adder circuits in the first level of the tree is different than the second number of adder circuits in the second level of the tree.

* * * * *